(12) United States Patent
Chen et al.

(10) Patent No.: US 6,887,450 B2
(45) Date of Patent: May 3, 2005

(54) DIRECTIONAL ASSEMBLY OF CARBON NANOTUBE STRINGS

(75) Inventors: Jian Chen, Richardson, TX (US); James R. Von Ehr, Richardson, TX (US)

(73) Assignee: Zyvex Corporation, Richardson, TX (US)

( * ) Notice: Subject to any disclaimer, the term of this patent is extended or adjusted under 35 U.S.C. 154(b) by 416 days.

(21) Appl. No.: 10/038,102

(22) Filed: Jan. 2, 2002

(65) Prior Publication Data

US 2003/0234465 A1 Dec. 25, 2003

(51) Int. Cl.[7] .................... C01B 31/00; B29C 51/00; H01L 21/00
(52) U.S. Cl. ................ 423/445 R; 423/447.1; 423/449.8; 423/460; 264/320; 264/334; 438/105
(58) Field of Search .................. 423/445 R, 460, 423/447.1, 449.8; 264/320, 334; 438/105, 765, 778

(56) References Cited

U.S. PATENT DOCUMENTS

| 5,482,601 A | 1/1996 | Ohshima et al. |
| 5,753,088 A | 5/1998 | Olk |

FOREIGN PATENT DOCUMENTS

| WO | WO 01/30694 A1 | 5/2001 |
| WO | WO 01/57917 A2 | 8/2001 |

OTHER PUBLICATIONS

Chen, Jian et al., "Room–Temperature Assembly of Directional Carbon Nanotube Strings," *J. Am. Chem. Soc.*, 124, 758–759 (2002).

Iijima, Sumio et al., "Structural flexibility of carbon nanotubes," *J. Chem. Phys.* 104 (5) 1996, 2089–2092.

Martel, Richard et al., "Rings of single–walled carbon nanotubes," *NATURE*, vol. 398, 1999, 299.

Franklin, Nathan et al., "An Enhanced CVD Approach to Extensive Nanotube Networks with Directionality." *Adv. Mater.* 2000 12, 890–894.

Zhang, Yuegang et al., "Electric–field–directed growth of aligned single–walled carbon nanotubes," *Applied Physics Letters*, vol. 79, No. 19, Nov. 5 2001.

Liu, Jie et al., "Controlled deposition of individual single–walled carbon nanotubes on chemically functionalized templates." *Chemical Physics Letters* 303 (1999) 125–129.

Bahr, Jeffrey L. et al., "Dissolution of small diameter single–wall carbon nanotubes in organic solvents?" Chem. Commun., 2001, 193–194.

Chen, Jian et al., "Dissolution of Full–Length Single–Walled Carbon Nanotubes," *J. Phys. Chem. B*. 2001, 105, 2525–2528.

Boul, P.J. et al., "Reversible sidewall functionalization of buckytubes," *Chemical Physics Letters* 310 (1999) 367–372.

(Continued)

*Primary Examiner*—Ha Tran Nguyen
(74) *Attorney, Agent, or Firm*—Haynes and Boone, LLP

(57) ABSTRACT

A solution containing randomized nanotubes is introduced into a channelized mold and the solution is dried resulting in a number of parallel nanotubes stretched across the walls of the channel. In one embodiment, the channels are open along their longitudinal axis and that opening is covered with a material, such as silicon. The solution is allowed to dry, preferably at room temperature, and as it recedes from the channel the receding solution tends to stretch certain of the nanotubes across the channel so that they become attached to the opposite walls of the channel. By varying the shapes and width of the channel sides various controlled nanotube lengths can be achieved. The mold, with the constructed nanotubes, can be positioned to mate with another structure for the transfer of the nanotubes to the second structure.

37 Claims, 5 Drawing Sheets

OTHER PUBLICATIONS

O'Connell, Michael J., et al., "Reversible water–solubilization of single–walled carbon nanotubes by polymer wrapping,".

Sun, Ya–Ping et al., "Soluble Dendron–Functionalized Carbon Nanotubes: Preparation, Characterization, and Properties," *Chem. Mater.* 2001, 13, 2864–2869.

Ausman, Kevin D. et al., "Organic Solvent Dispersions of Single–Walled Carbon Nanotubes: toward Solutions of Pristine Nanotubes," *J. Phys. Chem B* 2000, 104, 8911–8915.

Dalton, A.B. et al., "Selective Interaction of a Semiconjugated Organic Polymer with Single–Wall Nanotubes," *J. Phys. Chem. B* 2000, 104, 10012–10016.

Star, Alexander et al., "Preparation and Properties of Polymer–Wrapped single–Walled Carbon Nanotubes," *Angew. Chem. Int. Ed.* 2001, 40, 1721–1725.

Chen, Robert J. et al., "Noncovalent Sidewall Functionalization of Single–Walled Carbon Nanotubes for Protein Immobiligation," *J. Am. Chem. Soc.* 2001, 123, 3838–3839.

Bahr, Jeffrey L. et al., "Functionalization of Carbon Nanotubes by Electrochemical Reduction of Aryl Diazonium Salts: A Bucky Paper Electrode," *J. Am. Chem. Soc.* 2001, 123, 6536–6542.

Schlittler, R.R. et al., "Single Crystals of Single–Walled Carbon Nanotubes Formed by Self–Assembly," *Science* 2001, 292, 1136–1139.

Smith, Brian W. et al., "Formation mechanism of fullerene peapods and coaxial tubes: a path to large scale synthesis," *Chem. Phys. Lett.* 2000, 321, 169–174.

Craighead, H.G., "Nanoelectromechanical Systems," *Science 2000, 290, 1532–1535.*

Baughman, Ray H. et al., "Carbon Nanotube Actuators," *Science 1999, 284, 1340–1344.*

Kong, Jing et al., "Nanotube Molecular Wires as Chemical Sensors," *Science 2000, 287, 622–625.*

Collins, Philip G. et al., "Extreme Oxygen Sensitivity of Electronic Properties of Carbon Nanotubes," *Science* 2000, 287, 1801–1804.

Srivastava, Deepak et al., "Predictions of Enhanced Chemical Reactivity of Regions of Local Conformational Strain on Carbon Nanotubes: Kinky Chemistry," *J. Phys. Chem. B* 1999, 103, 4330–4337.

Tombler, Thomas W. et al., "Reversible electromechanical characteristics of carbon nanotubes under local–probe manipulation," *Nature* 2000, 405, 769–772.

Derycke, V. et al., "Carbon Nanotube Inter– and Intramolecular Logic Gates," *Nano Lett.* 2001, 1, 453–456.

Bachtold, Adrian et al., "Logic Circuits with Carbon Nanotube Transistors," *Science* 2001, 294, 1317–1320.

Banhart, Florian, "The Formation of a Connection between Carbon Nanotubes in an Electron Beam," *Nano Lett.* 2001, 1, 329–332.

Tang, Z.K. et al., "Superconductivity in 4 Angstrom Single–Walled Carbon Nanotubes," *Science* 2001, 2462–2465.

Collins, Philip G. et al., "Engineering Carbon Nanotubes and Nanotube Circuits Using Electrical Breakdown," *Science* 2001, 292, 706–709.

Kim, Enoch et al., "Micromolding in Capillaries: Applications in Materials Science," *J. Am. Chem. Soc.* 1996, 118, 5722–5731.

Messer, Benjamin et al., "Microchannel Networks for Nanowire Patterning," *J. Am. Chem. Soc.* 2000, 122, 10232–10233.

Huang, Yu et al., "Directed Assembly of One–Dimensional Nanostructures into Functional Networks," *Science* 2001, 291, 630–633.

Yakobson, Boris et al., "Fullerene Nanotubes: $C_{1,000,000}$ and Beyond," *Amer. Scientist*, 1997, 85, 324–337.

Rinzler, A.G. et al., "Large–scale purification of single–wall carbon nanotubes: process, product, and characterization," *Appl. Phys. A* 1998, 67, 29–37.

Journet, C. et al., "Large–scale production of single–walled carbon nanotubes by the electric–arc technique," *NATURE*, 1997, 388, 756–758.

Journet, C. et al., "Production of carbon nanotubes," *Appl. Phys. A* 1998, 67, 1–9.

Nikolaev, Pavel et al., "Gas–phase catalytic growth of single–walled carbon nanotubes from carbon monoxide," *Chem. Phys. Lett* 1999 313, 91–97.

Franklin, Nathan R. et al., "An Enhanced CVD Approach to Extensive Nanotube Networks with Directionality," *Adv. Mater.* 2000, 12, 890–894.

Dresselhaus, M.S. et al., *Science of Fullerenes and Carbon Nanotubes*, 1966, San Diego: Academic Press, 901–906.

Mattson, Mark P. et al., " Molecular Functionalization of Carbon Nanotubes and Use as Substrates for Neuronal Growth," *J. Molecular Neuroscience*, 2000, 14, 175–182.

Gerdes, S. et al., "Combing a carbon nanotube on a flat metal–insulator–metal nanojunction," *Europhys. Lett.* 1999 48 (3) 292–298.

Li, J. et al., "Highly–Ordered Carbon Nanotube Arrays For Electronics Applications," Applied Physics Letters, American Institute of Physics, New York, US, vol. 75, No. 3, pp. 367–369, Jul. 19, 1999.

Hornyak, G.L., et al., "Template Synthesis of Carbon Nanotubes," Nanostructured Materials, Elsevier, New York, New York, US, vol. 12, No. 1–4, pp. 83–88, 1999.

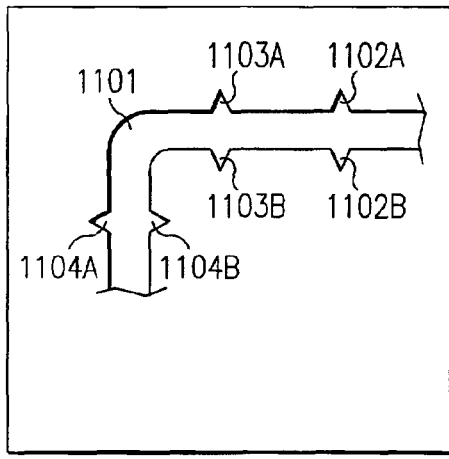
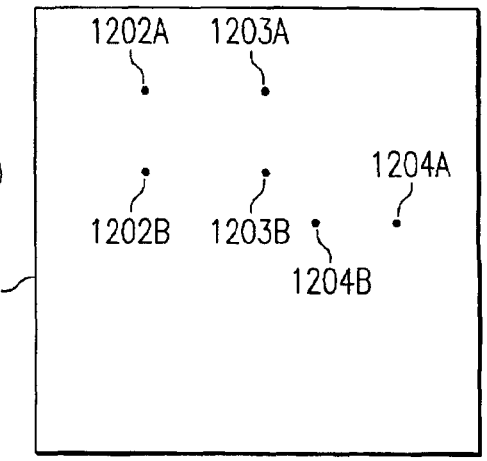
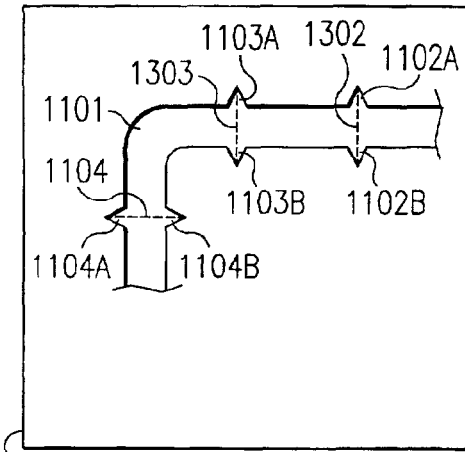
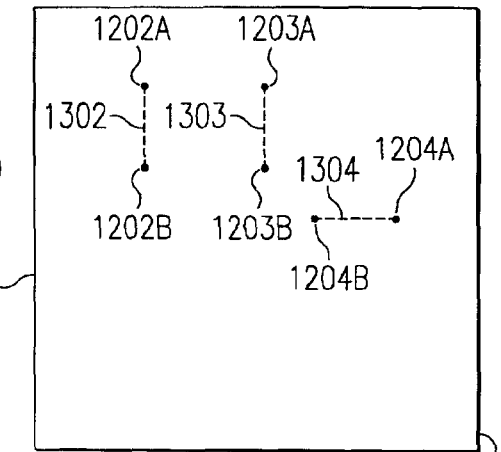

DIRECTIONAL ASSEMBLY OF CARBON NANOTUBE STRINGS

BACKGROUND OF THE INVENTION

1. Technical Field

The present invention is related to positioning of nanotubes, and more particularly to a system and method that allows for directional positioning of nanotubes at substantially room temperature.

2. Background

A carbon nanotube can be visualized as a sheet of hexagonal graph paper rolled up into a seamless tube and joined. Each line on the graph paper represents a carbon—carbon bond, and each intersection point represents a carbon atom.

In general, carbon nanotubes are elongated tubular bodies which are typically only a few atoms in circumference. The carbon nanotubes are hollow and have a linear fullerene structure. The length of the carbon nanotubes potentially may be millions of times greater than their molecular-sized diameter. Both single-walled carbon nanotubes (SWNTs), as well as multi-walled carbon nanotubes (MWNTs) have been recognized.

Carbon nanotubes are currently being proposed for a number of applications since they possess a very desirable and unique combination of physical properties relating to, for example, strength and weight. Carbon nanotubes have also demonstrated electrical conductivity. See Yakobson, B. I., et al., *American Scientist*, 85, (1997), 324–337; and Dresselhaus, M. S., et al., Science of Fullerenes and Carbon Nanotubes, 1996, San Diego: Academic Press, pp. 902–905. For example, carbon nanotubes conduct heat and electricity better than copper or gold and have 100 times the tensile strength of steel, with only a sixth of the weight of steel. Carbon nanotubes may be produced having extraordinarily small size. For example, carbon nanotubes are being produced that are approximately the size of a DNA double helix (or approximately 1/50,000$^{th}$ the width of a human hair).

Considering the excellent properties of carbon nanotubes, they are well suited for a variety of uses, from the building of computer circuits to the reinforcement of composite materials, and even to the delivery of medicine. As a result of their properties, carbon nanotubes may be useful in microelectronic device applications, for example, which often demand high thermal conductivity, small dimensions, and light weight. Perhaps most promising is their potential to act as nano-wires and even tiny transistors in ultra dense integrated circuits. One potential application of carbon nanotubes that has been recognized is their use in flat-panel displays that use electron field-emission technology (as carbon nanotubes can be good conductors and electron emitters). Further potential applications that have been recognized include electromagnetic shielding, such as for cellular telephones and laptop computers, radar absorption for stealth aircraft, nano-electronics (including memories in new generations of computers), and use as high-strength, lightweight composites. Further, carbon nanotubes are potential candidates in the areas of electrochemical energy storage systems (e.g., lithium ion batteries) and gas storage systems.

Various techniques for producing carbon nanotubes have been developed. As examples, methods of forming carbon nanotubes are described in U.S. Pat. Nos. 5,753,088 and 5,482,601, the disclosures of which are hereby incorporated herein by reference. The three most common techniques for producing carbon nanotubes are: 1) laser vaporization technique, 2) electric arc technique, and 3) gas phase technique (e.g., HiPCO™ process), which are discussed further below.

In general, the "laser vaporization" technique utilizes a pulsed laser to vaporize graphite in producing the carbon nanotubes. The laser vaporization technique is further described by A. G. Rinzler et al. in *Appl. Phys. A*, 1998, 67, 29, the disclosure of which is hereby incorporated herein by reference. Generally, the laser vaporization technique produces carbon nanotubes that have a diameter of approximately 1.1 to 1.3 nanometers (nm). Such laser vaporization technique is generally a very low yield process, which requires a relatively long period of time to produce small quantities of carbon nanotubes. For instance, one hour of laser vaporization processing typically results in approximately 100 milligrams of carbon nanotubes.

Another technique for producing carbon nanotubes is the "electric arc" technique in which carbon nanotubes are synthesized utilizing an electric arc discharge. As an example, single-walled nanotubes (SWNTs) may be synthesized by an electric arc discharge under helium atmosphere with the graphite anode filled with a mixture of metallic catalysts and graphite powder (Ni:Y;C, as described more fully by C. Journet et al. in *Nature* (London), 388 (1997), 756. Typically, such SWNTs are produced as close-packed bundles (or "ropes") with such bundles having diameters ranging from 5 to 20 nm. Generally, the SWNTs are well-aligned in a two-dimensional periodic triangular lattice bonded by van der Waals interactions. The electric arc technique of producing carbon nanotubes is farther described by C. Journet and P. Bernier in *Appl. Phys. A*, 67, 1, the disclosure of which is hereby incorporated herein by reference. Utilizing such an electric arc technique, the average carbon nanotube diameter is typically approximately 1.3 to 1.5 nm and the triangular lattice parameter is approximately 1.7 nm. As with the laser vaporization technique, the electric arc production technique is generally a very low yield process that requires a relatively long period of time to produce small quantities of carbon nanotubes. For instance, one hour of electric arc processing typically results in approximately 100 milligrams of carbon nanotubes.

More recently, Richard Smalley and his colleagues at Rice University have discovered another process, the "gas phase" technique, which produces much greater quantities of carbon nanotubes than the laser vaporization and electric arc production techniques. The gas phase technique, which is referred to as the HiPCO™ process, produces carbon nanotubes utilizing a gas phase catalytic reaction. The HiPCO™ process uses basic industrial gas (carbon monoxide), under temperature and pressure conditions common in modern industrial plants to create relatively high quantities of high-purity carbon nanotubes that are essentially free of by-products. The HiPCO™ process is described in further detail by P. Nikolaev et al. in *Chem. Phys. Lett.*, 1999, 313, 91, the disclosure of which is hereby incorporated herein by reference.

While daily quantities of carbon nanotubes produced using the above-described laser vaporization and electric arc techniques are approximately 1 gram per day, the HiPCO™ process may enable daily product of carbon nanotube in quantities of a pound or more. Generally, the HiPCO™ technique produces carbon nanotubes that have relatively much smaller diameters than are typically produced in the laser vaporization or electric arc techniques. For instance, the nanotubes produced by the HiPCO™ technique generally have diameters of approximately 0.7 to 0.8 nm.

Carbon nanotubes are commonly produced (e.g., using the above-described techniques) in relatively long, highly tangled ropes. For example, SWNTs produced by the HiPCO™ process (which are available from Carbon Nanotechnologies, Inc.) generally comprise relatively long (e.g., >4 micrometers ($\mu$m)) and relatively thick (e.g., 20–100 nm) ropes formed by a plurality of highly tangled carbon nanotubes.

Controlled assembly of remarkably flexible SWNTs into various designed architectures, a key to building nanotube devices, remains a tremendous challenge. Dai et al. developed a chemical vapor deposition (CVD) approach to directed growth of suspended SWNT networks at 900° C. (*Adv. Mater.* 2000, 12, 890–894; *Appl. Phys. Lett.* 2001, 79, 3155–3157). The disadvantage of this approach is that at 900° C. many materials cannot survive. In addition, using this approach the diameters of the nanotubes are not homogeneous. In the first paragraph of their paper (*Appl. Phys. Lett* 2001, 79, 3155–3157), Dai et al. clearly pointed out: "however, postgrowth manipulation and assembly of SWNTs have not been very successful thus far."

BRIEF SUMMARY OF THE INVENTION

The present invention is directed to a system and method which allows for the post-growth assembly and manipulation of nanotubes in a controlled fashion such that the resulting nanotubes are positioned in a specific pattern and have controlled lengths. The system and method of our invention is achieved at substantially room temperature.

In operation, we use a channelized mold and within each channel of the mold we introduce a solution containing randomized nanotubes. In one embodiment, the channels are open along their longitudinal axis and that opening is covered with a material, such as silicon. The solution that is introduced into the channels flows through each channel and is allowed to dry, preferably at room temperature. The solution, as it recedes from the channel, tends to stretch certain of the nanotubes across the channel so that they become attached to the opposite walls of the channel, all roughly parallel to each other. By varying the shapes and width of the channel sides various controlled lengths can be achieved.

In one embodiment of the invention one or more additional materials can be introduced into the channels creating laminar flows within the channels so as to selectively control the widths of the channel thereby controlling the lengths of the produced nanotubes.

In another embodiment, the mold, with the constructed nanotubes, can be positioned to mate with another structure for the depositing of the nanotubes on the second structure. The geometry of the mold then would be such that the nanotubes constructed at certain points of the mold would have lengths and physical orientations proper for the mating structure.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIGS. 11–14 show an example of a transfer process using the concepts of this invention.

DETAILED DESCRIPTION OF THE INVENTION

Figure 1:
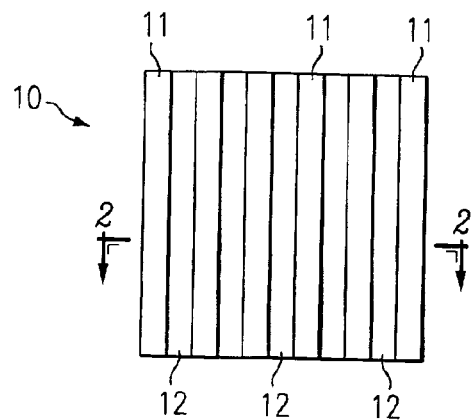
FIG. 1 shows one embodiment of a channelized material.

FIG. 1 shows a top view of a Poly dimethylsiloxane (PDMS), micromold 10, having formed therein channels 12, separated by body 11 of the PDMS. The micromold was prepared according to known techniques, such as for example as shown in an article by Kim and others in the Journal of American Chemistry Society 1996, 118, 5722–5730, which is hereby incorporated by reference herein. The prepared micromold was cured at 75° C. for 2–3 hours. In a preferred embodiment, both ends of the micromold can be cut with a razor blade to form microchannels 500–700 micrometers ($\mu$m) in width, and approximately 1 $\mu$m in height.

Figure 2:
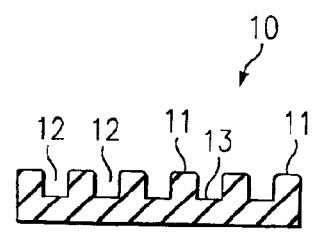
FIG. 2 is a cross-section view taken through section 2—2 of FIG. 1.

FIG. 2 shows a cross section of FIG. 1, taken through Section 2—2 showing the mold turned with the open sections of the "U" channels (the section opposite side 13) facing upward. The sizes of the channels depend on the particular application and the nanostructures to be assembled. The length of each channel does not seem to be critical. A mold having approximate 5,000 channels each approximately 1 millimeter in length was used. While multiple channels are shown the process will work for any number of channels, including a single channel.

Figure 3:
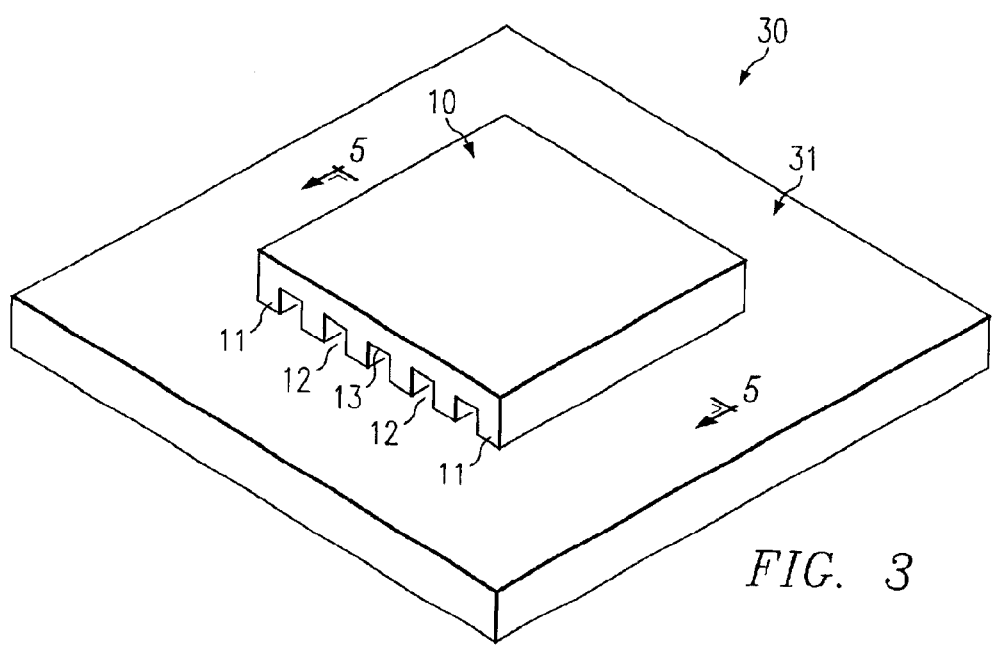
FIG. 3 shows the channelized mold in combination with a removable cover.
Figure 4:
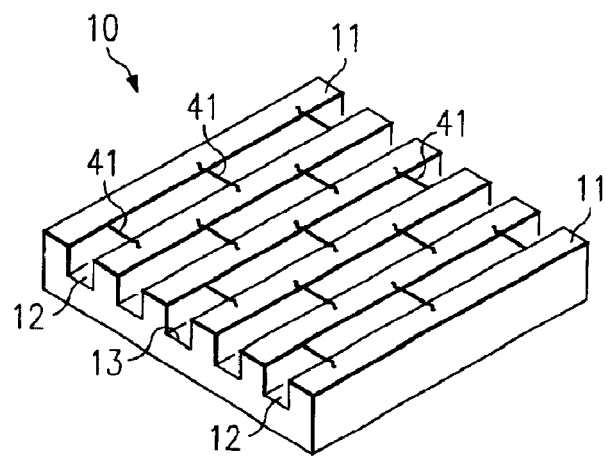
FIG. 4 shows the mold after the nanotubes have been formed across the sides thereof.

As shown in FIG. 3, mold 10 (also called a stamp) is placed with the open sections of the channels facing downward onto the surface of cover 31. Cover 31 is, in a preferred embodiment, silicon, but could be other material, including glass and the like. Once cover 31 is in place a drop of solution is applied to the open end of the channels. The solution contains relatively small diameter (0.7–0.8 μm) SWNTs from, for example, Carbon Nanotechnologies, Inc., which are sonicated in a 3:2 mixture of chloroform/chlorobenzene to yield a stable, visually non-scattering solution (~3×10$^{-3}$ mg/ml). A drop (0.2–1.0 ul) of the nanotube solution is placed at the open end of microchannels, allowing the channels to fill via capillary action. This soluble nanotube solution, which has been placed within the microchannels is then allowed to dry (or evaporate) in the air at essentially room temperature. After drying, PDMS micromold 10 and cover 31 are carefully separated from each other and mold 10 is turned so that the open channels are facing upward, as shown in FIG. 4. This then allows for the harvesting of nanotubes established in a preordained orientation.

Many different solutions could be used. For example, the nanotube solutions can be prepared according to Bahr and others, as shown in Chem. Commun., 2001, 193–194 and Chem and others, as shown in J. Phys. Chem. B2001, 105, 2525–2528, both of which are incorporated by reference herein. An alternate channel dimension is 4.5 μm in width, and 1.6 μm in height. The drying time varies from a few hours to more than 12 hours.

FIG. 4 shows a drawing of what a scanning electron microscopy (SEM) would show. As can be seen there are now many near-parallel straight SWNT strings 41 formed across microchannels 12 on PDMS micromold 10. Similar results were obtained by using soluble laser-grown nanotubes (diameter 1.1–1.3 μm) in a 3 mixture of chloroform/chlorobenzene. Also, the solvents are not limited to chlorobenzene and chloroform but may be various organic or inorganic solvents, which depend on the characteristics of the one dimensional nanostructures to be assembled. Although the detailed nanotube structures are difficult to resolve under SEM, the majority of freestanding nanotube strings are believed to be either small ropes or individual nanotubes, as indicated by previous atomic force microscopy (AFM) studies of soluble SWNTs. A control experiment was carried out in which a drop of blank 3:2 of chloroform/chlorobenzene was placed at the open end of microchannels. No freestanding strings were found on the PDMS micromold, therefore excluding the possibility of organic solvent-induced artifaces. No detectable distortion of the PDMS micromold was observed under SEM after the experiment. It is crucial to adjust the concentration of nanotubes as well as solvents in order to minimize the aggregation of nanotubes on the PDMS micromask so as to achieve good directionality of suspended nanotubes.

Figure 5:
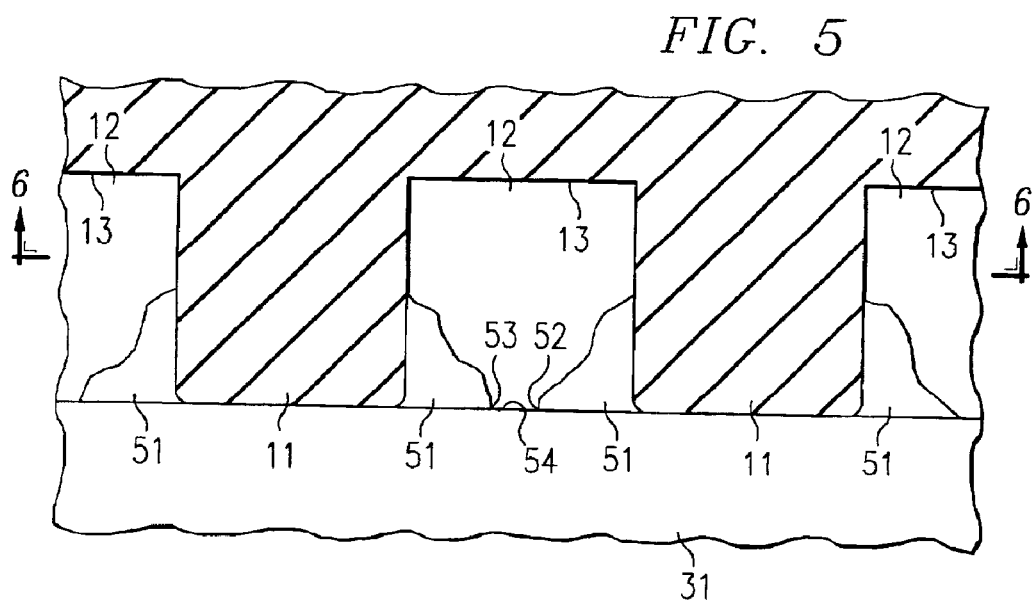
FIG. 5 shows a cross-section of the mold, taken through section 5—5 of FIG. 3, in combination with the removable cover, having liquid nanotube material evaporating therein.

FIG. 5 shows a possible formation mechanism of directional nanotube strings such that inside the microchannel, chloroform (BP 61° C.) vaporizes rapidly, and the front edges 52, 53 of the remaining chlorobenzene liquid (bp 132° C.) recedes into the two corners 51 of channel 12. FIG. 5 is a cross-section view of channel 12 in contact with cover 31. Messer et al first reported this phenomenon in J. Am. Chem. Society 2000, 122, 10232–10233. Upon solvent evaporation, capillary forces are exerted by liquid front line 52, 53 upon carbon nanotubes along dry surface 54 of cover 31. As a result of this force, some nanotubes are believed to be reoriented, stretched and aligned perpendicular to the liquid front edge as shown by nanotube 41 in FIG. 6 which is a top view looking down on dry surface 54 along the liquid receding lines 52, 53.

Figure 6:
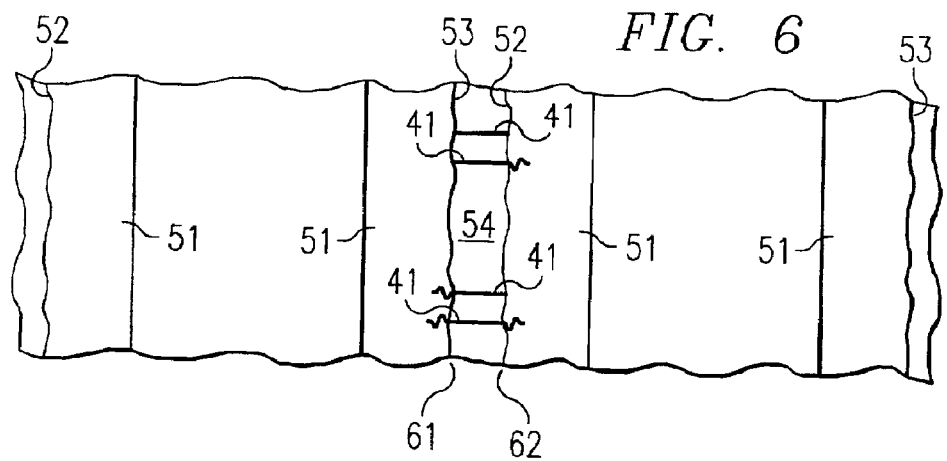
FIG. 6 shows a cross-section of the mold, taken through section 6—6 of FIG. 5, illustrating the tension acting on a single nanotube as the liquid evaporates.

In FIG. 6, the liquid has receded to points 61, 62 which are essentially the channel sides interfacing with cover 31 (shown in FIG. 5). As the remaining chlorobenzene completely vaporizes, those nanotubes with sufficient lengths are stretched across the channel and become attached to the two corner surfaces 71, 72 (FIG. 7) of the PDMS microchannel. The originally flexible nanotubes are now as straight and tight as strings across the microchannels. Because of the receding nature of the forces they tend to be perpendicular to the liquid front receding edge 52, 53, which, in turn, makes the nanotubes perpendicular to the sides of the channel.

It is likely that organic liquid occasionally penetrates into the original contact area between PDMS micromold and silicon substrate, because nanotubes with lengths considerably longer than the channel width can also be seen under SEM. When using larger microchannels with width ~4.5 pm and height ~1.6 μm, freestanding strings were not observed, which is in agreement with previous observations that the average lengths of soluble nanotubes are less than 4 μm.

The ability of a single receding liquid front line to comb the nanotubes on a substrate, has previously been demonstrated in a manner which also requires a certain chemically functionalized surface in order to achieve the orientation of nanotubes with ~45% efficiency. The double receding liquid front lines disclosed herein appear to significantly improve the alignment of nanotubes across the microchannels on an unmodified PDMS micromask, and the orientation efficiency is estimated to be over 70% under optimized condition.

By carefully choosing the appropriate material and geometry of the micromold, solvents, substrate as well as surface functionalization, it is possible to realize length-selective assembly of two-dimensional ordered suspended nanotube strings, which could then allow transfer-printing of crossed nanotube arrays chemically-functionalized and/or electroactive surfaces.

It was found that a higher nanotube concentration in the solvent can lead to the aggregation of nanotubes on PDMS, and decrease the directionality of nanotubes. The best results were achieved with a nanotube concentration range between $1 \times 10^{-3}$–$1 \times 10^{-2}$ mg/ml using the described 3:2 mixture of chloroform/chlorobenzene. Pure chloroform appears to lower orientation efficiency of SWNTs, possibly because chloroform vaporizes too fast to allow nanotubes to adjust the direction. Tetrahydrofuran can significantly deform the PDMS stamp and appears unsuitable for assembly experiments.

Figure 7:
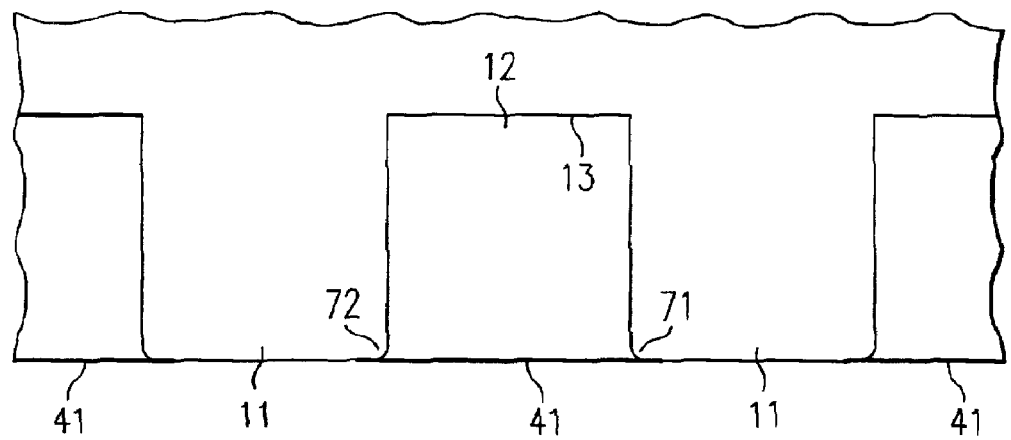
FIG. 7 shows the nanotube stretched across the side of the channel where the liquid is gone.

As discussed, when the solvent completely vaporizes, the two ends of certain carbon nanotubes are attracted to the edges of the channel. The nanotubes in the solution must be at least as long as the width of the channel and oriented such that the receding liquid front lines (as discussed above) can drag the ends into perpendicular alignment with the channel sides. This is shown in FIG. 7 where nanotube 41 is shown attached to points 71, 72 on the sides of channel 12. PDMS has a stronger interaction with the carbon nanotubes than does the silicon substrate, allowing for a physical attachment with the PDMS and not with the cover.

Accordingly, in addition to this being a system for aligning the nanotubes, it also is a system for eliminating some nanotubes which are not of a certain length, yielding a more uniform, or controlled, nanotube length.

The micromold used was PDMS, but it is thought that many other materials will work. These other materials can be silicon, polymers, ceramics and metal. The process, as discussed, can be used also for other nanostructures, such as DNA, nanowires, and the like.

Figure 8:
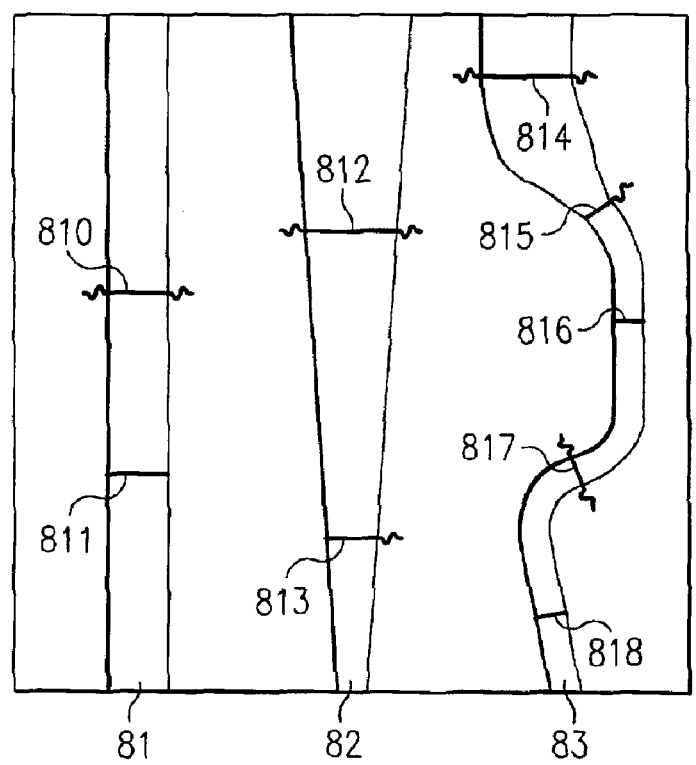
FIGS. 8 and 9 show variations of channel construction.

FIG. 8 illustrates one system for sorting by length by changing the width of the channel. Shown is a top view of mold 80 looking down into channels 81, 82 and 83. Channel 81 is shown with parallel sides and is similar to channel 12 as discussed above. The nanotubes, such as 810 and 811, are all the same length and parallel to each other. Channel 82 is shown with sides which expand from each other, thereby establishing nanotubes which, while still parallel to each other, have different controlled lengths, such as are shown by 812 and 813. Channel 83 is shown with sides which change direction and change spacing therebetween, yielding nanotubes of different lengths and different orientations relative to each other, such as are shown by nanotubes 814, 815, 816, 817 and 818.

Figure 9:
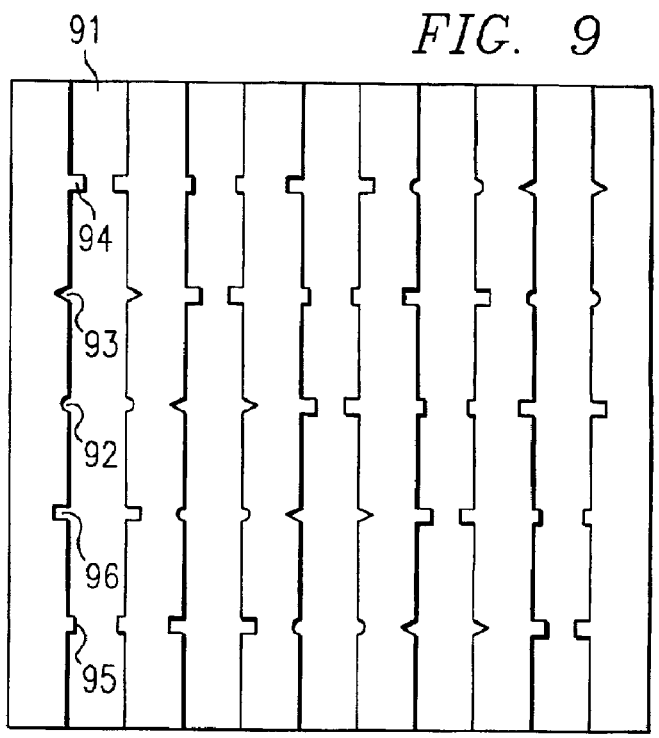

FIG. 9 illustrates the positioning of nanotubes by constructing irregularities in the side walls of the channels. The fluid will flow into V groove 93 in the side wall of channel 91 (or any other shaped side structure 92, 94, 95, 96) so that the groove (or other structure) will contain the last bit of fluid in the channel. The groove, such as groove 93, FIG. 9, is arranged such that the length of the nanotube suspended between opposing grooves can be controlled, depending on the width and depth of the geometry. Also, by changing shapes, such as 92–96, different lengths, and structures could be achieved. It should be understood that any shape would work and they need not be exactly perpendicular across the channel. This would make the resulting nanotubes positioned as desired across the channel.

Elements 94 and 95 are alternatives that rely on changing the nature of the side wall functionalization of the channel to control the wetting properties of the sidewall. That would also change where the fluid would stick and where it would not stick, and would allow positional control along the lengths of the channel. As will be discussed herein, it is important to place the nanotubes in known locations because the mold could then be used to transfer the nanotubes onto another structure. This process is called transfer printing of carbon nanotube arrays and will be discussed with respect to FIGS. 11–14.

Figure 10:
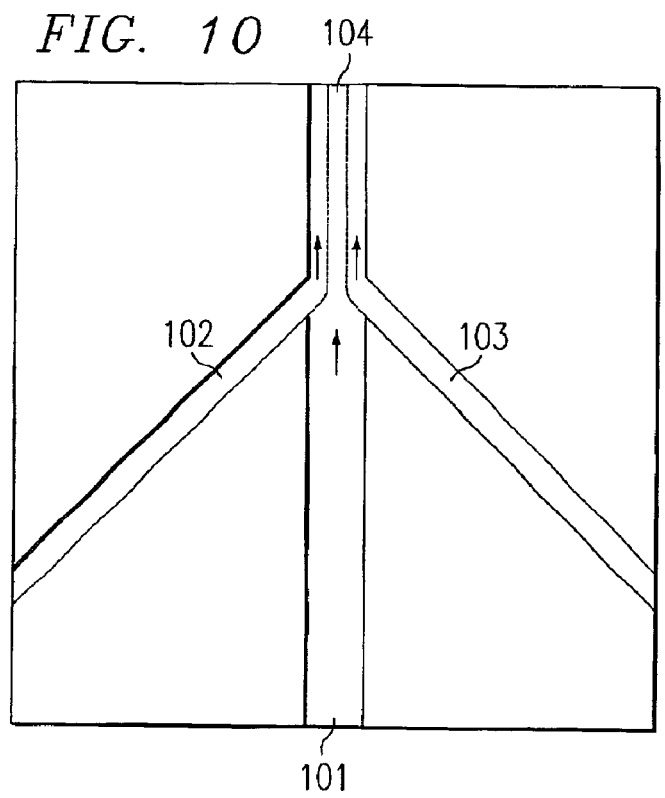
FIG. 10 shows an alternate arrangement for controlling the length of the nanotube.

FIG. 10 shows three channels, 101, 102 and 103 leading into one channel 104. By choosing different solvents in each channel 101, 102, and 103, and controlling the flow rates, laminar flow is created in composite channel 104, where the fluid subchannels 101, 102, and 103 do not mix. By controlling relative flows in the three channels, 101, 102 and 103, and the overall width of channel 104, one can modulate all three relative channel widths. Further channels may be added downstream, or composite stream 104 split back into individual channels by inverting the geometry of the original mixing point where channels 101, 102, and 103 come together. It is known that laminar flow could bend around circles and S curves, and the fluids will continue to flow in a laminar fashion.

Using this laminar approach, it would be possible to place the nanotube solution in one channel, say channel 101, and have a different solution, that the nanotubes are more soluble in, flowing in channels 102 and 103. Alternatively, one could put the nanotubes in channel 102, put pure solvent without nanotubes in channel 103, and a different solvent of low nanotube affinity in channel 101. In either case, by bending the composite channel 104 around a corner, long nanotubes entrained in the laminar flow could be forced to poke their ends into both subchannels 102 and 103, thus spanning subchannel 101 (multiwall and short to medium length single wall nanotubes are not flexible enough to bend sharply around corners, so traversing a corner would cause the ends of the tube to dip into both subchannels 102 and 103 and thereafter become entrained by the increased solubility of the nanotube in those solvents). Nanotubes shorter than the cross section of subchannel 101 would not be able to span that subchannel 101, and would thus stay in their original channel.

Once a nanotube end is entrained in both subchannels 102 and 103, it is carried along in the flow in a continuous fashion, crosswise to the flow in composite channel 104. Such length-selected tubes may then be coalesced into just a single subchannel, and separated from shorter tubes in the other subchannel. Further downstream bending and channel splitting would allow tubes with an end in each of subchannels 102 and 103 to be moved to just one of those subchannels. By controlling bending and channel splitting, it can be seen that tubes of a particular length may be selectively transferred between subchannels, say between 102 and 103, in a continuous manner, providing a desired result of selecting tubes of a particular length out of channel 102 and transferring them to channel 103.

FIG. 11 shows mold 1100 with curving channel 1101 which has formed therein a series of defined location pairs (1102 A,B; 1103 A,B; 1104 A,B) where nanotubes are to be formed by the process described above.

FIG. 12 shows structure 1200 (which can be a single surface or multi-dimensional) arranged to receive nanotubes at selected points therein 1202 A,B; 1203 A,B; 1204 A,B. The nanotubes to be formed by mold 1100 are designed to mate with the desired placement in structure 1200.

FIG. 13 shows nanotubes 1302, 1303 and 1304 formed in channel 1101 at pre-selected positions. Of course, many channels can be used as discussed above.

FIG. 14 shows the result of the nanotube transfer when mold 1100 is folded over mating structure 1200, such that edge pairs 1310, 1410 and 1311, 1411 are brought together to control the mirror image transfer. This, of course, is only one transfer method and many such are possible.

The assembly technique discussed above could, in principle, apply to not only a wide range of nanotubes in their soluble or dispersible forms, including small diameter (0.7–0.8 $\mu$m) nanotubes, covalent- and noncovalent-functionalized SWNTs, monodispersed SWNTs with identical diameter and chirality, and multiwalled nanotubes, which either cannot survive the high temperature treatment or cannot be synthesized by current CVD method; but also other soluble or dispersible one-dimensional nanostructures such as nanowires, DNA, and the like as well as nanotubes made of other elements, such as boron-nitride (BN) and the like. Nanotubes include any small object of high aspect ratio, particularly rods of metal, semiconductor, or insulators; bacteria; viruses; polypeptides; or assemblies of any of these items. Such objects should be small enough such that capillary forces can move and align them, and that they can be suspended in a material, such as liquid, whereby capillary forces can act upon them. Accordingly, the word nanotube herein and in the claims should be read to include such structures.

This process could enable the systematic studies of diameter- and functionalization-dependence of freestanding nanotube's physical properties without the interference of significant nanotube-substrate surface interactions. The resulting directional freestanding nanotube strings may find applications in nanoelectromechanical devices, chemical and biological sensors, nanotube "kinky chemistry", nanoscale electronic circuits, directed neuronal growth, as well as transfer-printing of crossed nanotube arrays. Nanotube strings can be further nano-welded to PDMS surfaces by electron beam under SEM to form robust structures. It should also be possible to use focused ion beam (FIB) nanoscale-deposition to make nanoelectrodes at the two ends of freestanding nanotubes. Electrical breakdown techniques may be used to fabricate pure semiconducting nanotubes rope by selectively removing metallic nanotubes in the rope.

The procedures described in this patent are intended to be performed at room temperature without auxiliary heat being added. But those skilled in the art will find that the concepts of this invention can be performed at various temperatures and in various ways. For example, heat can be used to speed up or otherwise control the drying of the solvent or centrifugal force can be used to help remove liquid. This heat can be in the form of an oven or a hand held dryer and can vary over the course of the drying interval. The limiting factors of how much heat should be used will depend upon the nanotube material, the stamp and the substrate with care being taken to not change the cross-section (unless of course a cross-section change is desired) and care also being taken to not change the compositional nature of the nanotubes, the stamp or the substrate. In fact, there is no reason to believe that the process will not work below room temperature, so long as there is provision for drying, or evaporating, of the solvent so as to cause the nanotubes to stretch across the defined channel. Accordingly, the term "room temperature" includes raised or lowered temperatures within the boundaries that, for any given nanotube material, the temperature used does not adversely affect that material.

Also, it will be understood by those skilled in the art that while the embodiment shown uses a mold which is turned over after the solution is dried, the procedure can also work with a mold that is substantially permanently oriented in a certain plane. Also, while the channels are shown as straight, any geometry of spaced apart side walls defining a confined space may be used. In particular, curved channels can be used to position nanotubes in different orientations. This is particularly important where a follow up processing step, such as transfer printing, is contemplated in which nanotube orientation is important.

Also, it should be noted that the term "nano" typically refers to a unit of meansure of $10^{-9}$ in scientific notation and a nanometer is $10^{-9}$ meters. however, in the description and claims herein the term "nano" refers to structures that are very small and would typically be thought of and measured in the nanometer range. The term is meant to cover structures with at least one dimension between 0.4 nm and 1000 nm. The preferred range for the process described herein is nanotube diameters between 0.4 nm and 400 nm, and nanotube lengths between 1 nm and 1 mm.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of selectively isolating a plurality of nanotubes, comprising:
    placing a channelized mold on a surface, the channelized mold having at least one section of a channel open, the placement such that said surface covers said section to form a covered channel;
    allowing a solution containing nanotubes to flow into said covered channel;
    drying said solution; and
    after drying said solution, separating said mold from said surface such that nanotubes are deposited across said channel.

2. The method of claim 1 wherein said mold has a plurality of channels and wherein said surface covers all of said channels.

3. The method of claim 1 wherein said channel has positioned therein contours which affect the length of said nanotubes.

4. The method of claim 3 wherein at least one of said contours includes a tapered channel.

5. The method of claim 3 wherein at least one of said contours include indentions in a side wall of said channel.

6. The method of claim 5 wherein at least one portion of one of said channel side walls has a solvent affinity that is different from that of a second portion of the channel side wall.

7. The method of claim 1 wherein said deposited nanotubes are substantially parallel to each other.

8. The method of claim 1 wherein said deposited nanotubes are substantially all of the same length.

9. The method of claim 1 wherein the length of each nanotube is a function of the geometry of the channel at the point in the channel that said nanotube is deposited.

10. The method of claim 1 wherein the mold is a PDMS micromold.

11. The method of claim 1 wherein the surface comprises silicon.

12. The method of claim 1 wherein the solution containing nanotubes flows into said covered channel by capillary action.

13. The method of claim 1 wherein the solution is dried at room temperature.

14. The method of claim 13 wherein said room temperature is changed within domestic limits.

15. The method of claim 1 further comprising:
    bringing said mold with said nanotubes created across a channel thereof into close proximity to a second surface; and
    transferring at least some of said nanotubes from said mold to said second surface.

16. The method of claim 15 wherein said mold has a contour to allow selected nanotubes deposited thereon to be transferred to preselected locations on said second surface.

17. The method of claim 1 wherein the solution containing nanotubes is allowed to flow into said covered channel under conditions in which laminar flow of materials controls the length of each said deposited nanotube in said channel.

18. A method of suspending nanotubes, comprising:
    placing a suspension of randomly organized nanotubes within a channel, said channel having spaced apart sides; and
    allowing said suspension to dry so as to encourage certain nanotubes to become suspended across said channel sides.

19. The method of claim 18 wherein said suspended nanotubes are the ones long enough and positioned such that they extend across said channel while in said suspension.

20. The method of claim 18 wherein said channel is open along its longitudinal axis, said method further comprising placing a temporary seal across said open channel.

21. The method of claim 20 further comprising:

removing said temporary seal after said suspension is dried.

22. The method of claim 20 wherein said seal comprises a silicon substrate.

23. The method of claim 18 wherein said channel sides are varied in width.

24. The method of claim 18 wherein said channel has a depth that is controlled.

25. The method of claim 18 wherein said suspension is placed by flowing within said channel at least one material other than said nanotube suspension.

26. The method of claim 18 wherein said channel has positioned therein contours which affect the length of said suspended nanotubes.

27. The method of claim 26 wherein at least one of said contours includes a tapered channel.

28. The method of claim 26 wherein at least one of said contours include indentions in a side wall of said channel.

29. The method of claim 26 wherein at least one of said contours includes a difference in solvent affinity at a side wall of said channel.

30. The method of claim 18 wherein said suspended nanotubes are substantially parallel to each other.

31. The method of claim 18 wherein said suspended nanotubes are substantially all of the same length.

32. The method of claim 18 wherein the length of each suspended nanotube is a function of the geometry of the channel at the point in the channel that said nanotube is formed.

33. The method of claim 18 wherein the channel is included in a PDMS micromold.

34. The method of claim 18 wherein said suspension is placed by capillary action.

35. The method of claim 18 wherein said suspension is dried at room temperature.

36. The method of claim 35 wherein said room temperature is changed within domestic limits.

37. The method of claim 18 further comprising:

bringing said channel with said suspended nanotubes into substantial contact with a second surface for the purpose of transferring at least some of said suspended nanotubes from said channel to said second surface.

* * * * *

UNITED STATES PATENT AND TRADEMARK OFFICE
CERTIFICATE OF CORRECTION

PATENT NO.    : 6,887,450 B2
DATED         : May 3, 2005
INVENTOR(S)   : Chen et al.

It is certified that error appears in the above-identified patent and that said Letters Patent is hereby corrected as shown below:

Column 2,
Line 31, the word "farther" should read -- further --.

Column 4,
Line 61, the word "approximate" should read -- approximately --.

Column 5,
Line 45, the word "artifaces" should read -- artifices --.

Column 6,
Line 15, "~4.5 pm" should read -- ~4.5$\mu$m --.

Column 9,
Line 42, the word "meansure" should read -- measure --.

Signed and Sealed this

Twelfth Day of July, 2005

JON W. DUDAS
*Director of the United States Patent and Trademark Office*